United States Patent
Huang et al.

(10) Patent No.: US 12,376,307 B2
(45) Date of Patent: Jul. 29, 2025

(54) SEMICONDUCTOR STRUCTURE, FABRICATION METHOD AND THREE-DIMENSIONAL MEMORY

(71) Applicant: YANGTZE MEMORY TECHNOLOGIES CO., LTD., Wuhan (CN)

(72) Inventors: Teng Huang, Wuhan (CN); Ziqun Hua, Wuhan (CN); Yanwei Shi, Wuhan (CN); Lan Yao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 550 days.

(21) Appl. No.: 17/727,553

(22) Filed: Apr. 22, 2022

(65) Prior Publication Data

US 2023/0068185 A1    Mar. 2, 2023

Related U.S. Application Data (63) Continuation of application No. PCT/CN2021/115816, filed on Aug. 31, 2021.

(51) Int. Cl.
*H10B 43/40*    (2023.01)
*H10B 41/40*    (2023.01)

(52) U.S. Cl.
CPC ............ *H10B 43/40* (2023.02); *H10B 41/40* (2023.02)

(58) Field of Classification Search
CPC ........ H10B 43/40; H10B 41/40; H10B 43/27; H10B 41/27; H10B 41/41; H10B 41/20; H10B 43/20; B10B 41/41
See application file for complete search history.

(56) References Cited

U.S. PATENT DOCUMENTS

| | | |
|---|---|---|
| 4,881,105 A | 11/1989 | Davari et al. |
| 2006/0154421 A1 | 7/2006 | Choi et al. |
| 2008/0121990 A1* | 5/2008 | Hasunuma ........ H01L 29/42368 438/270 |
| 2008/0185641 A1* | 8/2008 | Kim .................. H01L 29/66621 257/E21.429 |
| 2009/0159966 A1 | 6/2009 | Huang |
| 2016/0181408 A1* | 6/2016 | Aichinger ........... H01L 29/7813 257/77 |
| 2016/0276225 A1* | 9/2016 | Kim ....................... H10B 10/12 |
| 2016/0351625 A1 | 12/2016 | Gee et al. |
| 2018/0350685 A1* | 12/2018 | Or-Bach ............ H03K 19/0948 |
| 2021/0327509 A1* | 10/2021 | Jung ..................... H10B 41/41 |

FOREIGN PATENT DOCUMENTS

| | | |
|---|---|---|
| CN | 1949481 A | 4/2007 |
| CN | 101546772 A | 9/2009 |
| CN | 104752431 A | 7/2015 |
| DE | 102019113208 A1 | 1/2020 |
| KR | 20050119245 A | 12/2005 |

* cited by examiner

*Primary Examiner* — Moazzam Hossain
(74) *Attorney, Agent, or Firm* — BAYES PLLC (57) ABSTRACT

The present disclosure provides a semiconductor device. The semiconductor device includes a transistor in active area. The active area is in a substrate and comprises a recess, a surface of the recess having an offset from a surface of the substrate. The transistor comprises a gate electrode, the gate electrode comprising a first portion in the recess and a second portion outside the recess.

20 Claims, 6 Drawing Sheets

SEMICONDUCTOR STRUCTURE, FABRICATION METHOD AND THREE-DIMENSIONAL MEMORY

CROSS-REFERENCE TO RELATED APPLICATIONS

This application is a continuation of International Application No. PCT/CN2021/115816, filed on Aug. 31, 2021, which is hereby incorporated by reference in its entirety.

BACKGROUND

The present application relates to the field of semiconductor technologies, and more particularly to a semiconductor structure, a fabrication method and a three-dimensional memory.

Three-dimensional memories (e.g., 3D NAND Flashes) are widely used in computers, solid-state drives and electronic devices due to their advantages such as high storage density, high programming speed etc. To meet the market demands of increasing memory capacity without increasing the memory footprint, three-dimensional memories need to have increased storage density and reduced dimensions.

In contrast to existing logic chips, the peripheral circuits in a three-dimensional memory include devices operating at different voltages, such as high-voltage (HV) devices and low-voltage (LV) devices. When the number of stack layers of memory cells arranged in an array of a three-dimensional memory is relatively low, the existing peripheral circuits can meet the requirements of high density and high Input/Output (I/O) speed. However, with increasing of the number of stack layers of the array memory cells and decreasing of the dimensions of the memory cell, the footprint of the peripheral circuits must meet increasingly tight requirements to match the array memory cells. As a result, how to reduce the footprint of the peripheral circuits has become a subject earning increasing attention in the development of three-dimensional memory technologies.

SUMMARY

The present application aims to provide a semiconductor structure, a fabrication method and a three-dimensional memory capable of reducing the footprint of peripheral circuits effectively while simplifying the process flow.

To solve the above-mentioned problem, the present application provides a method of fabricating a semiconductor structure. The method includes: providing a substrate including a first device region and a second device region; ion-doping the first device region and the second device region; forming at least one first recess and at least one second recess in the first device region and the second device region in a vertical direction perpendicular to the substrate respectively; forming a first dielectric layer and a second dielectric layer on the first device region and the second device region respectively, wherein the first dielectric layer is located at least partially on an inner wall of the first recess, the second dielectric layer is located at least partially on an inner wall of the second recess, and the thickness of the first dielectric layer is larger than that of the second dielectric layer; forming a first gate and a second gate on the first dielectric layer and the second dielectric layer respectively, and forming a source and a drain on both sides of each of the first gate and the second gate respectively, wherein a portion of the first gate is in the first recess and the other portion of the first gate is above the first recess, and a portion of the second gate is in the second recess and the other portion of the second gate is above the second recess.

The substrate further includes a third device region.

The first, second and third device regions include respectively a high-voltage, a low-voltage and a low-low-voltage device regions.

After the ion-doping of the first device region and the second device region, the method further includes: forming a plurality of isolation structures in the first device region and the second device region respectively in the vertical direction perpendicular to substrate.

The first dielectric layer and the second dielectric layer are formed on the first device region and the second device region respectively through thermal oxidation reaction.

To solve the above-mentioned problem, an embodiment of the present application also provides a semiconductor structure. The semiconductor structure includes: a substrate including a first device region and a second device region; a plurality of first transistors disposed in the first device region, wherein the first transistor includes a first dielectric layer at least partially located in a first recess and a first gate on the first dielectric layer, and a portion of the first gate is in the first recess, and the other portion of the first gate is above the first recess; a plurality of second transistors disposed in the second device region, wherein the second transistor includes a second dielectric layer at least partially located in a second recess and a second gate on the second dielectric layer, a portion of the second gate is in the second recess and the other portion of the second gate is above the second recess, and the thickness of the first dielectric layer is larger than that of the second dielectric layer.

The semiconductor structure further includes: a third device region on the substrate; and a plurality of third transistors disposed in the third device region, wherein the third transistor includes a third dielectric layer at least partially located in a third recess and a third gate on the third dielectric layer, a portion of the third gate is in the third recess and the other portion of the third gate is above the third recess, and the thicknesses of the first, second and third dielectric layers decrease in this order.

A plurality of isolation structures are disposed among the plurality of first transistors, the plurality of second transistors and the plurality of third transistors to separate the plurality of first transistors, the plurality of second transistors and the plurality of third transistors from each other.

The cross-sectional shapes of the first, second and/or third recesses comprise inverted trapezoidal shape or arc shape.

To solve the above-mentioned problem, an embodiment of the present application also provides a three-dimensional memory. The three-dimensional memory includes an array memory structure and peripheral circuits, wherein any of the semiconductor structures described above may be disposed in the peripheral circuits.

The present application provides a semiconductor structure, a fabrication method and a three-dimensional memory. A method of fabricating a semiconductor structure includes: providing a substrate including a first device region and a second device region; ion-doping the first device region and the second device region; forming at least one first recess and at least one second recess in the first device region and the second device region in a vertical direction perpendicular to the substrate respectively; forming a first dielectric layer and a second dielectric layer on the first device region and the second device region respectively, wherein the first dielectric layer is located at least partially on an inner wall of the first recess, the second dielectric layer is located at least partially on an inner wall of the second recess, and the thickness of the first dielectric layer is larger than that of the second dielectric layer; forming a first gate and a second gate on the first dielectric layer and the second dielectric layer respectively, and forming a source and a drain on both sides of each of the first gate and the second gate respectively, wherein a portion of the first gate is in the first recess and the other portion of the first gate is above the first recess, and a portion of the second gate is in the second recess and the other portion of the second gate is above the second recess. By forming the first gate and the second gate each having one portion in the substrate and the other portion above the substrate, the footprint of the peripheral circuits is reduced effectively, while a self-aligning process can be used to simplify the process flow, making further development of semiconductor technologies possible.

BRIEF DESCRIPTION OF THE DRAWINGS

Accompanying drawings, which are incorporated herein and form a part of the description, illustrate embodiments of the present disclosure and, together with the description, further serve to explain the principles of the present disclosure and enable those skilled in the art to make and use the present disclosure.

DETAILED DESCRIPTION

The present application will be described in detail hereafter with reference to accompanying drawings and embodiments. It is particularly noted that the following embodiments are only used to illustrate the present application and not to define its scope. Likewise, the following embodiments are only some, not all, of the embodiments of the present application, and all the other embodiments obtained by those of ordinary skills in the art without any creative works belong to the scope claimed by the present application.

In addition, as mentioned in the present application, the orientation terms such as "upper", "lower", "front", "back", "left", "right", "inner", "outer", "lateral" or the like are only the orientations referred to by the accompanying drawings. Therefore, the orientation terms are used to illustrate, facilitate understanding of, but not limit the present application. In the figures, similar reference numerals represent elements of similar structures. For clarity, components in the figures are not drawn to scale. In addition, some well-known components may not be shown in the figures.

To make the purpose, technical solutions and advantages of the present application more clearly, more detailed description of the present application will be made in the following with reference to accompanying drawings.

Figure 1:
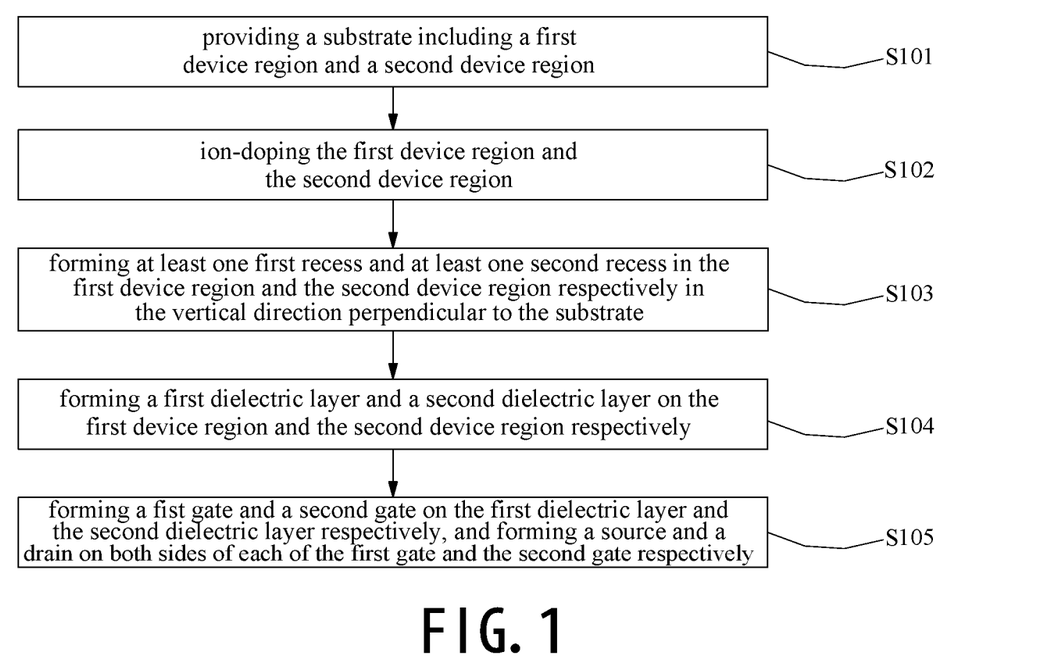
FIG. 1 is a flowchart of a method of fabricating a semiconductor structure according to one embodiment of the present application.

As shown in FIG. 1, the present application provides a method of fabricating a semiconductor structure. The method can reduce the footprint of peripheral circuits effectively and may include a specific process flow as follows and corresponding to the structural diagrams in FIGS. 2 to 7.

In step S101, a substrate 210 is provided. The substrate 210 includes a first device region and a second device region.

Specifically, the method of fabricating a semiconductor structure in an embodiment of the present application will be described in detail in connection with FIGS. 2-7.

Figure 2:
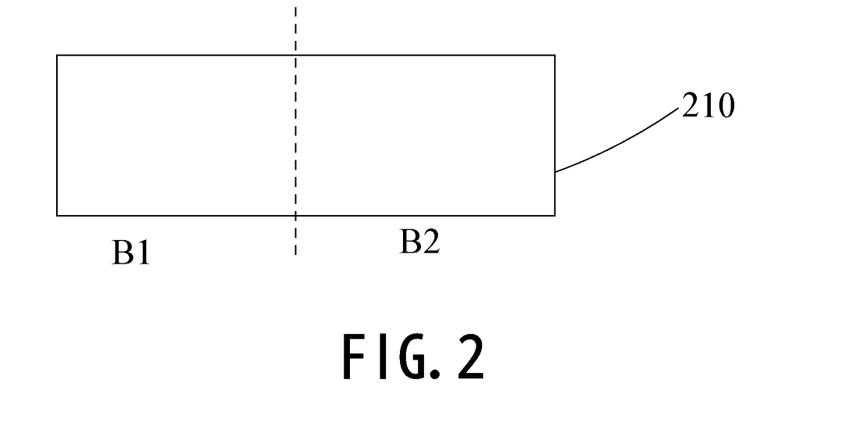
FIG. 2 is a structural diagram in which a substrate is provided according to the embodiment of the present application.

The structure formed in the step S101 is shown in FIG. 2 and includes the substrate 210 as well as the first device region and the second device region at the region B1 and region B2 respectively as shown in FIG. 2. The substrate 210 serves as the foundation to form semiconductor devices and may be semiconductor materials, such as silicon (Si), germanium (Ge), silicon germanium (GeSi), silicon carbide (SiC) etc., or any other materials.

In step S102, the first device region and the second device region are ion-doped.

Figure 3:
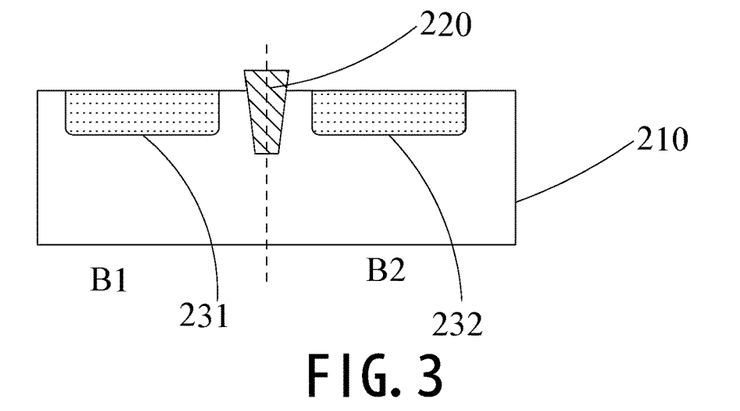
FIG. 3 is a structural diagram in which a first active area and a second active area formed according to the embodiment of the present application.

The structure formed after the step S102 is shown in FIG. 3 and includes the substrate 210 as well as a first active area 231 and a second active area 232.

Specifically, the first device region and the second device region are doped to form a first active area 231 and a second active area 232 in the first device region and the second device region, respectively. An active area (AA) refers to an area which forms a source and a drain and is covered by conductive channel. In the step S101, after the substrate 210 is provided, well regions are formed by ion-implanting the substrate 210 one or more times, and then the substrate 210 is divided into a plurality of regions by an etching process. These regions may be the first active area 231 or the second active area 232. That is, the first active area 231 and the second active area 232 disposed separately from each other are formed in the substrate 210.

Specifically, the well regions may be P-wells or N-wells depending on the ion-implanted dopants. For example, P-wells may be formed in the substrate 210 when P-type dopants are ion-implanted, while N-wells may be formed in the substrate 210 when N-type dopants are ion-implanted. Generally, both the first active area 231 and the second active area 232 have P-wells or N-wells formed therein to eventually form PMOS devices or NMOS devices.

Moreover, It is to be noted that, different from the implementation in which gate oxide layers of different thicknesses are formed in different device regions, when the step S102 in the embodiment of the present application, i.e. forming the separately disposed first active area 231 and the second active area 232 in the substrate 210, is performed, there is no gate oxide layer covering any portion of the substrate 210, i.e. a self-aligning process may be used when forming a photoresist layer corresponding to the patterning of the first active area 231 and the second active area 232. That is to say, when forming the photoresist layer for patterning of the first active area 231 and the second active area 232, there is no gate oxide layer on the substrate 210 which cover any portion of the substrate 210, and at this time, the process of alignment with the gate oxide layer is avoided, thus simplifying the process flow and making further development of semiconductor technologies possible.

After the step S102, the method further includes:

forming a plurality of isolation structures 220 in the first device region and the second device region respectively in the vertical direction perpendicular to the substrate 210.

The materials of the isolation structures 220 comprise oxides.

Specifically, as shown in FIG. 3, the plurality of isolation structures 220 is present in the first device region, the second device region and between the first device region and the second device region. The isolation structures 220 may be shallow trench isolations (STIs) and used to laterally isolate the NMOS regions or PMOS regions. Generally, the material of the shallow trench isolation is oxide, e.g., silicon dioxide ($SiO_2$).

Figure 4:
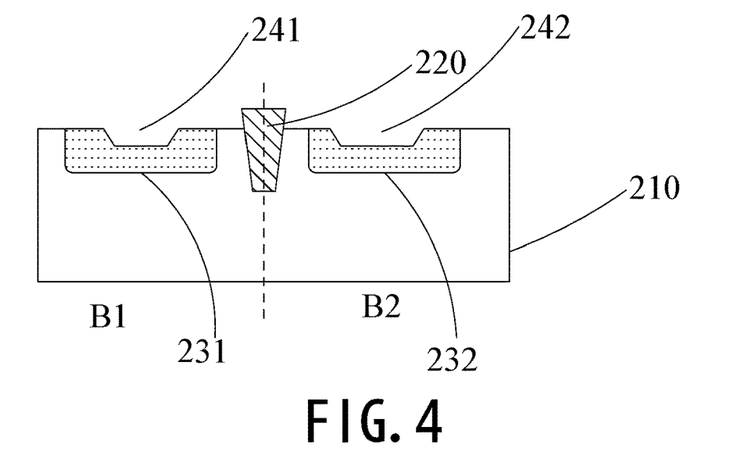
FIG. 4 is a structural diagram of a first recess and a second recess according to the embodiment of the present application.

In step S103, at least one first recess 241 and at least one second recess 242 are formed in the first device region and the second device respectively in the vertical direction perpendicular to the substrate 210.

The structure formed after the step S103 is shown in FIG. 4 and includes the substrate 210, the first active area 231 and the second active area 232, and the first recess 241 and the second recess 242.

Specifically, at least one first recess 241 and at least one second recess 242 may be formed in the first active area 231 of the first device region and the second active area 232 of the second device region respectively using an etching process, in the vertical direction perpendicular to the substrate 210.

Figure 5:
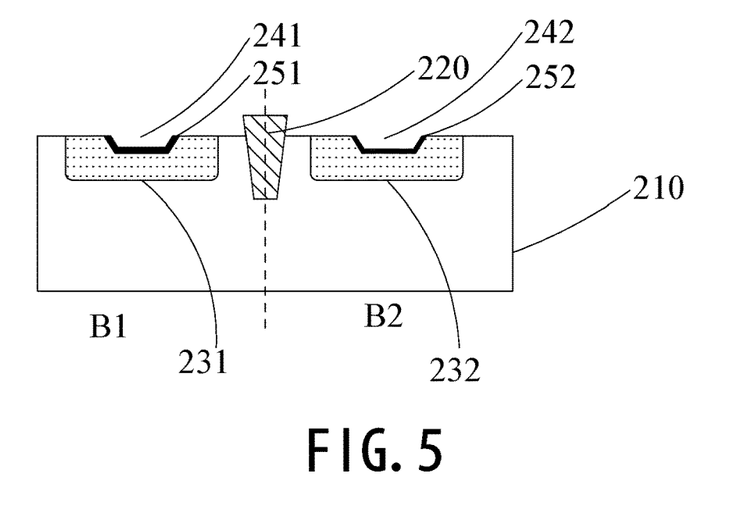
FIG. 5 is a structural diagram in which a first dielectric layer and a second dielectric layer are formed according to the embodiment of the present application.

In step S104, a first dielectric layer 251 and a second dielectric layer 252 are formed on the first device region and the second device region respectively. The first dielectric layer 251 is located at least partially on an inner wall of the first recess 241 and the second dielectric layer 252 is located at least partially on an inner wall of the second recess 242, with the thickness of the first dielectric layer 251 being larger than that of the second dielectric layer 252.

The structure formed after the step S104 is shown in FIG. 5 and includes the substrate 210, the first active area 231 and the second active area 232, the first recess 241 and the first dielectric layer 251 therein, and the second recess 242 and the second dielectric layer 252 therein. Both the first dielectric layer 251 and the second dielectric layer 252 have the heights lower than the substrate 210, and the thickness of the first dielectric layer 251 is larger than that of the second dielectric layer 252.

The first dielectric layer 251 and the second dielectric layer 252 are formed in the first device region and the second device region respectively through thermal oxidation reaction.

Specifically, the first dielectric layer 251 and the second dielectric layer 252 respectively may be in the first recess 241 of the first device region and the second recess 242 of the second device region, and used as a dielectric layer to maintain the insulation between the substrate 210 and the gates. Since the maximum operating voltage of the first active area 231 is higher than that of the second active area 232, accordingly, the thickness of the first dielectric layer 251 is larger than that of the second dielectric layer 252, such that the first dielectric layer 251 and the second dielectric layer 252 could perform better as dielectric layers.

Specifically, the first recess 241 and the second recess 242 are both in the substrate 210. Generally, the substrate 210 is silicon, whose natural oxide is silicon dioxide. When exposed to an environment with oxidizer at a relatively high temperature, a thin layer of oxide will be gradually formed on all of the silicon surfaces in contact with the oxidizer. Dielectric layers of high quality may be formed through thermal oxidation reaction as, for example, the first dielectric layer 251 and the second dielectric layer 252 which are the gate oxide layer. Moreover, in the process flow, the thermally grown oxide may be used as a mask for implantation, diffusing or etching.

Specifically, thermal oxidation reaction refers to a wafer in an atmosphere of gas oxidizer, such as molecular oxygen (O2) and/or water vapor (H2O), at a high temperature (generally in the range of 900-1200° C.). The thermal oxidation reaction is dry oxidation when the gas oxidizer is molecular oxygen and wet oxidation when the gas oxidizer is water vapor. By the thermal oxidation reaction, an initial oxide layer is first formed at the gas/solid interface, and the oxidizer needs to penetrate through the initial oxide layer by diffusing and reach the surface of the wafer so as to form an oxide layer. That is, the oxidizer, upon reaching the surface of the wafer, must penetrate the newly formed oxide layer. Repeat this cycle and the first dielectric layer 251 and the second dielectric layer 252 are eventually formed. The first dielectric layer 251 and the second dielectric layer 252 may be formed with controlled thicknesses by controlling the temperature, speed constants (such as type of the oxidizer and surface property of the wafer) and duration of the thermal oxidation reaction.

Moreover, the first dielectric layer 251 and the second dielectric layer 252 are generally formed separately, instead of simultaneously. For example, a photoresist layer is first formed using photolithography on the substrate 210 for the first patterning of the first recess 241. With the masking of the photoresist layer for the first patterning, the first dielectric layer 251 with a relatively large thickness is formed only in the first recess 241 through thermal oxidation reaction. Subsequently, a photoresist layer is formed using photolithography on the substrate 210 for the second patterning of the second recess 242. At this point, the photoresist layer for the second patterning has corresponding openings over both of the first recess 241 and the second recess 242. Since the first dielectric layer 251 is relatively thick and, to enable thermal oxidation reaction, the oxidizer needs to penetrate the relatively thick first dielectric layer 251 that is just formed, it is much more difficult to form an oxide layer on the first dielectric layer 251 than on the first recess 241. In addition, since the thickness of the oxide layer subsequently formed on the relatively thick first dielectric layer 251 can be negligible with respect to the thickness of the first dielectric layer 251 that is already formed, it can be considered that the second dielectric layer 252 is formed only in the second recess 242. In this way, the first dielectric layer 251 and the second dielectric layer 252 are formed in the first recess 241 and the second recess 242 respectively through thermal oxidation reaction. Both of the first dielectric layer 251 and the second dielectric layer 252 have the heights lower than the substrate 210 and the thickness of the first dielectric layer 251 is larger than that of the second dielectric layer 252.

Figure 6:
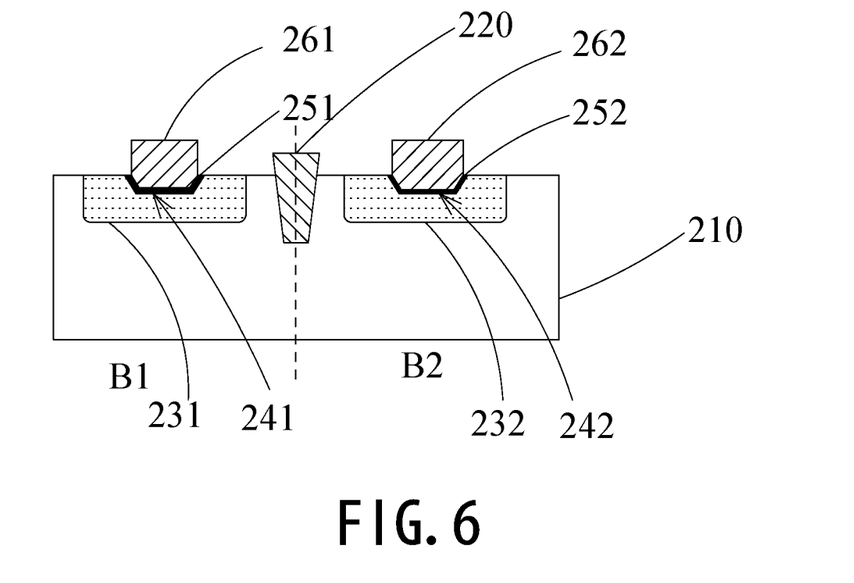
FIG. 6 is a structural diagram in which a first gate and a second gate are formed according to the embodiment of the present application.

In step S105, a first gate 261 and a second gate 262 are formed on the first dielectric layer 251 and the second dielectric layer 252 respectively, and a source and a drain are formed on both sides of each of the first gate 261 and the second gate 262 respectively. A portion of the first gate 261 is in the first recess 241 and the other portion of the first gate 261 is above the recess 241, and a portion of the second gate 262 is in the second recess 242 and the other portion of the second gate 262 is above the second recess 242.

The structure formed after the operation of forming the first gate 261 and the second gate 262 on the first dielectric layer 251 and the second dielectric layer 252 respectively in the step S105 is shown in FIG. 6 and includes the substrate 210, the first active area 231 and the second active area 232, the first dielectric layer 251 and the first gate 261 thereon, and the second dielectric layer 252 and the second gate 262 thereon. Each of the first gate 261 and the second gate 262 has a portion in the substrate 210 and the other portion above the substrate 210. The thickness of the first dielectric layer 251 is larger than that of the second dielectric layer 252.

Specifically, after the formation of the first dielectric layer 251 and the second dielectric layer 252, conductive materials may be filled into the first recess 241 and the second recess 242 through physical vapor deposition (PVD) to form the first gate 261 and the second gate 262 corresponding to the first recess 241 and the second recess 242 respectively. A portion of the first gate 261 and a portion of the second gate 262 are located in the first recess 241 and the second recess 242 respectively, and the other portion of the first gate 261 and the other portion of the second gate 262 are located above on substrate 210 respectively. That is to say, the tops of the first gate 261 and the second gate 262 are higher than the top of the substrate 210.

The conductive materials include any one of polysilicon, tungsten or aluminum.

Specifically, since the first gate 261 and the second gate 262 are used to control the semiconductor devices to turn on/off, and thus often use conductive materials, such as, but not limited to, polysilicon (Poly), tungsten (W), aluminum (Al) or any other conductive materials.

The cross-sectional shapes of the first recess 241 and the second recess 242 include inverted-trapezoidal shape or arc shape.

With increasing of integration of semiconductor devices, dimensions of the devices are decreasing. As dimensions of the devices become smaller, the channel length of the gate decreases as well, so that the I/O speed becomes slower due to the leakage current caused by short channel effects and hot carrier effects. In order to alleviate the phenomenon, recess gates are used in the embodiment of the present application. As shown in FIG. 6, the first recess 241 and the second recess 242 are formed with cross-sectional shapes of inverted trapezoid in the substrate 210 and then the dielectric layer and gate layer are sequentially formed in the first recess 241 and the second recess 242, so as to form the recess gates, which have portions in the substrate 210 and portions above the substrate 210. With the recess gates, effective contact areas between the gates and the active areas are increased and the channel lengths of the gates are elongated, so that the problem of slow I/O of the semiconductor devices is alleviated and footprint of the semiconductor devices can be made smaller.

Furthermore, it is to be noted that the cross-sectional shape of the first recess 241 and the second recess 242 may be an inverted-trapezoidal shape or a arc shape, or any other shape such as a rectangular shape, a sphere shape or the like, as long as the effective contact areas between the first recess 241 and the second recess 242 and the active areas as well as the channel lengths of the gates can be increased.

Figure 7:
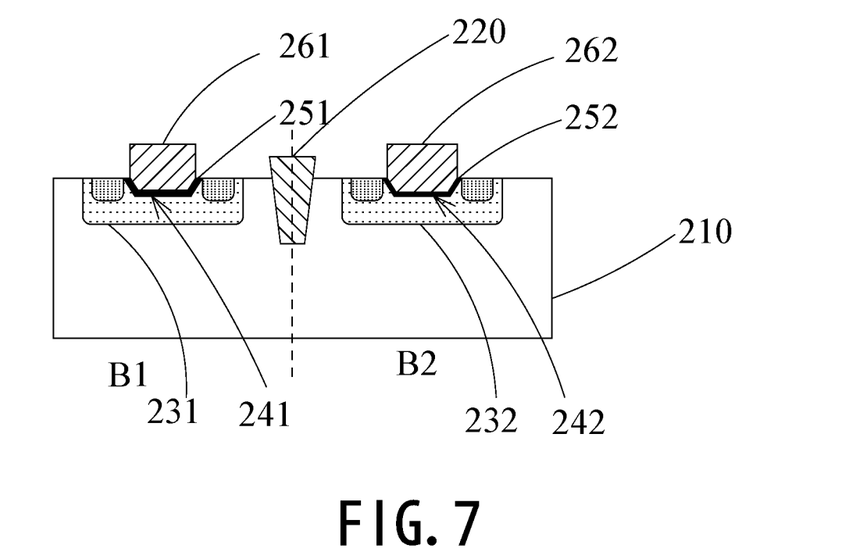
FIG. 7 is a structural diagram in which a semiconductor structure are formed according to the embodiment of the present application.

The structure formed after forming a source and a drain on both sides of each of the first gate 261 and the second gate 262 respectively in step S105 is shown in FIG. 7 and includes the substrate 210, the separately disposed first active area 231 and second active area 232, the first dielectric layer 251 and the first transistor thereabove corresponding the first gate 261, as well as the second dielectric layer 251 and the second transistor thereabove corresponding the second gate 262. The first gate 261 and the second gate 262 have portions in the substrate 210 and portions above the substrate 210.

As can be seen from the description above, in the process flow, thermally grown oxide may be used as a mask for ion implantation, diffusing or etching. For example, after the first dielectric layer 251 and the second dielectric layer 252 which serve as gate oxide layers are formed, the first gate 261 and the second gate 262 are formed on the first dielectric layer 251 and the second dielectric layer 252 respectively. Since the first gate 261 and the second gate 262 are very thick and have their tops higher than the top of the substrate 210, the first gate 261 and the second gate 262 may be used as a masking layer for the formation of the sources and drains to prevent ions from being implanted into the regions below the first gate 261 and the second gate 262 (the first gate 261 and the second gate 262 are thick enough that ion-implanted atoms cannot reach the first dielectric layer 251 and the second dielectric layer 252). Therefore, the source and drain are formed only on both sides of the first gate 261 and the second gate 262 (while the ion-implanted atoms can easily penetrate through the corresponding gate oxide layer over the source and drain to form the source and drain). That is to say, with the first gate 261 and the second gate 262, self-aligning is made between sources, drains and the first and the second gates 261, 262.

In particular, the transistors are classified into PMOS transistors and NMOS transistors. A PMOS transistor is known as a P-type metal oxide semiconductor and an NMOS transistor is known as an N-type metal oxide semiconductor. A transistor includes a gate and a source and a drain on both sides of the gate. A driving voltage is applied onto the gate to control the conduction between the source to the drain, and thus control the conduction of the circuit in a semiconductor device.

With the development of semiconductor devices, more devices with different maximum operating voltages are needed, then accordingly, a third device region may also be formed in the peripheral circuits of a three-dimensional memory, then the third device region being formed on the side of the second device region away from the first device region.

The first, second and third device regions include respectively a high-voltage, a low-voltage and a low-low-voltage device regions.

In particular, the first and second device regions correspond to different maximum operating voltages respectively. For example, the first device region is an HV device region and the second device region is an LV device region. Different from a logic chip, since a three-dimensional memory needs to perform the operations of reading, writing and erasing, and different operations need different operating voltages, then, a plurality of devices providing different maximum operating voltages are needed to be formed in the peripheral circuits of a three-dimensional memory, and accordingly a high-voltage device region and a low-voltage device region are needed to be formed in the peripheral circuits of a three-dimensional memory. However, with the development of semiconductor devices, devices with more different maximum operating voltages are needed and accordingly a low-low-voltage device region is also needed in the peripheral circuits of a three-dimensional memory.

Figure 8:
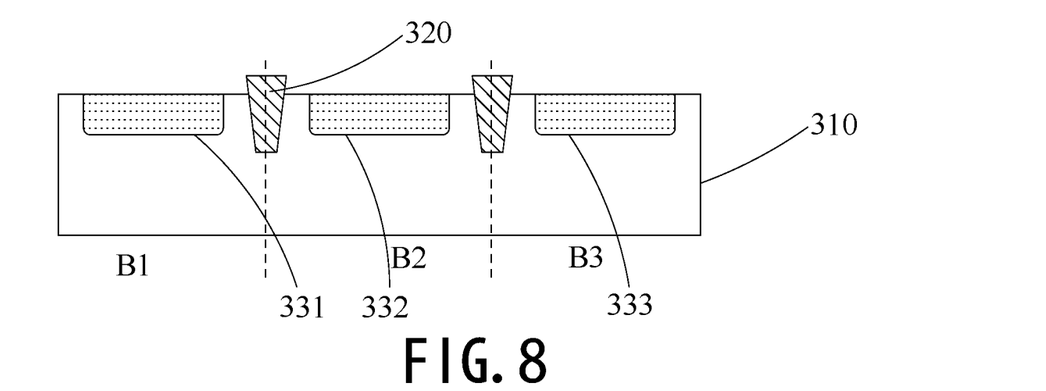
FIG. 8 is a structural diagram in which a first active area, a second active area and a third active area are formed according to another embodiment of the present application.

As shown in FIG. 8, the first, second and third device regions are respectively located at the regions B1, B2 and B3 as shown in FIG. 8, and the first, second and third device regions are respectively a high-voltage, a low-voltage and a low-low-voltage device regions.

Different from the structure, formed after the step S102 and as shown in FIG. 3, comprising the substrate 210 as well as the first active area 231 and the second active area 232 formed respectively by performing ion implantation on the first and second device regions, as shown in FIG. 8, the structure, formed after the step S102 in another embodiment of the present application, has a substrate 310 as well as a first active area 331, a second active area 332 and a third active area 333 formed respectively by performing ion implantation on the first, second and third device regions. Since the first, second and third device regions are formed on substrate 310, the subsequent steps S103-S106 need to be adapted considering the third device region.

A plurality of isolation structures 320 are also formed in the first, second and third device regions respectively, in the vertical direction perpendicular to the substrate 310.

Figure 9:
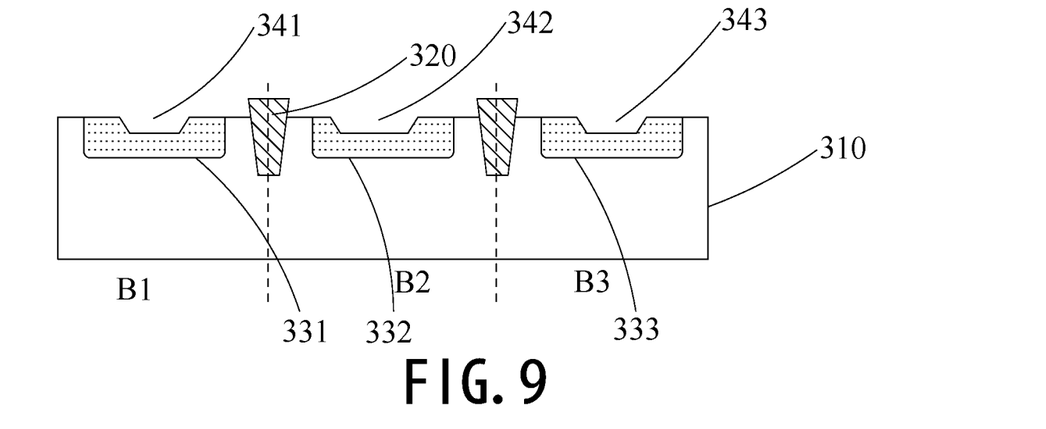
FIG. 9 is a structural diagram of a first recess, a second recess and a third recess according to another embodiment of the present application.

Subsequently, the above-mentioned step S103 is adapted considering the third device region, as shown in FIG. 9, at least one first recess 341, at least one second recess 342 and at least one third recess 343 are formed in the first, second and third device regions respectively in the vertical direction perpendicular to the substrate 310.

Figure 10:
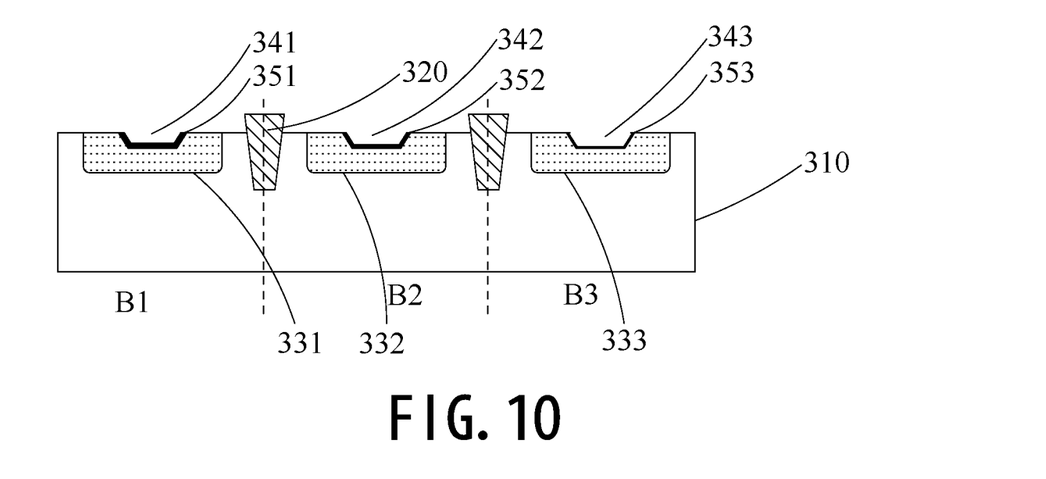
FIG. 10 is a structural diagram in which a first dielectric layer, a second dielectric layer and a third dielectric layer are formed according to another embodiment of the present application.

Next, the above-mentioned step S104 is adapted considering the third device region, as shown in FIG. 10, a first dielectric layer 351, a second dielectric layer 352 and a third dielectric layer 353 are formed respectively in the first recess 341, the second recess 342 and the third recess 343, wherein the thickness of the first dielectric layer 351 is less than the depth of the first recess 341, the thickness of the second dielectric layer 352 is less than the depth of the second recess 342 and the thickness of the first dielectric layer 351 is larger than that of the second dielectric layer 352.

Figure 11:
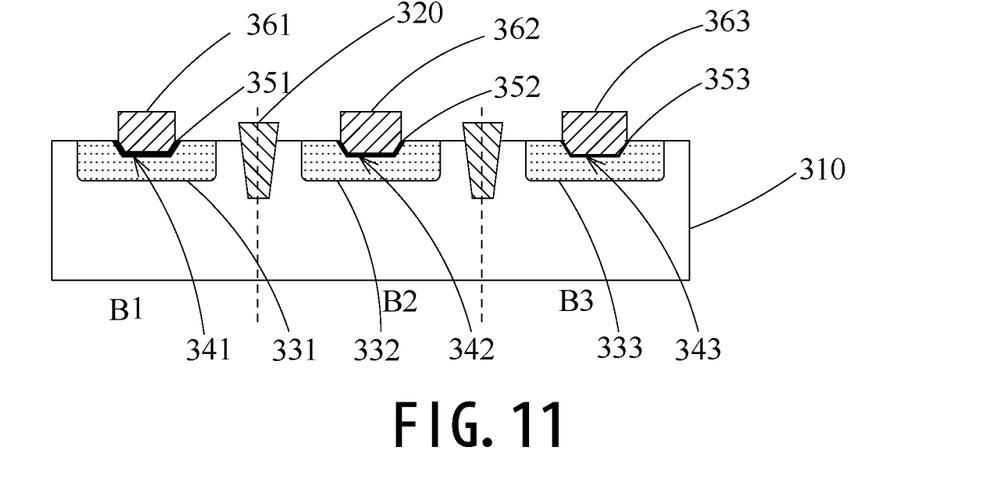
FIG. 11 is a structural diagram in which a first gate, a second gate and a third gate are formed according to another embodiment of the present application.

Thereafter, the above-mentioned step S105 of forming the first gate 261 and the second gate 262 on the first dielectric layer 251 and the second dielectric layer 252 respectively is adapted considering the third device region, as shown in FIG. 11, a conductive material is filled into the first recess 341, the second recess 342 and the third recess 343 to form first gate 361, second gate 362 and third gate 363 corresponding to the first recess 341, the second recess 342 and the third recess 343 respectively, and the tops of the first gate 361, second gate 362 and third gate 363 are higher than the top of the substrate 310.

Figure 12:
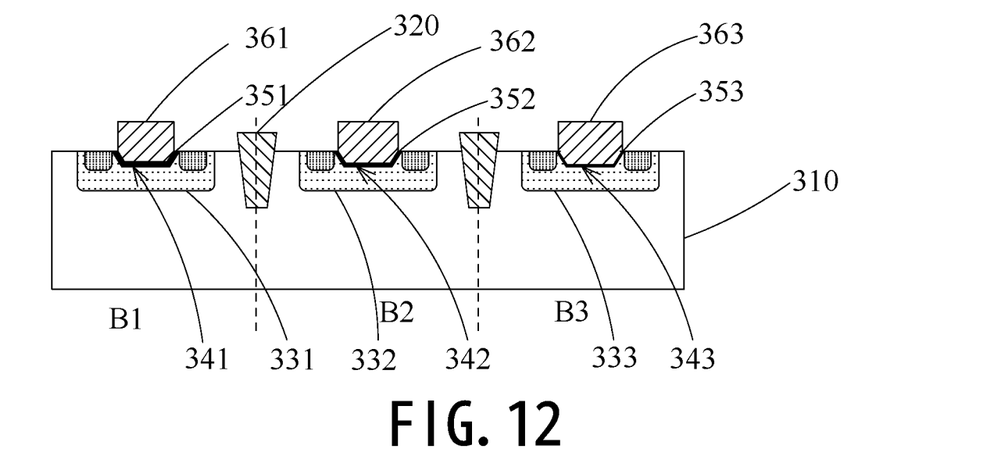
FIG. 12 is a structural diagram in which a semiconductor structure formed according to another embodiment of the present application.

Finally, the above-mentioned step S105 of forming the source and the drain on both sides of each of the first gate 261 and the second gate 262 respectively is adapted considering the third device region, as shown in FIG. 12, a source and a drain are formed on both sides of each of the first gate 361, the second gate 362 and the third gate 363 respectively to form the first, second and third transistors corresponding to the first gate 361, the second gate 362 and the third gate 363 respectively.

Furthermore, it is to be noted that the specific process flow of steps S102-S105 has been discussed in detail above and the process flow represented by the structural diagrams of FIGS. 8-12 is substantially consistent with the that specific process flow and only adapted considering the third device region, so that related description will not be repeated here.

Furthermore, in addition to the high-voltage, low-voltage and low-low-voltage device regions, one or more device regions distinct from them may be formed in the peripheral circuits, which is not limited.

Based on the method of fabricating a semiconductor structure in any embodiment described above, an embodiment of the present application also provides a semiconductor structure, which includes a substrate 210 having a first device region and a second device region; the first device region has a plurality of first transistors disposed therein and the first transistor includes a first dielectric layer 251, at least a portion of which is in a first recess 241, a first gate 261 of the first transistor is located on the first dielectric layer 251, a portion of the first gate 261 is in the first recess 241 and the other portion of the first gate 261 is above the first recess 241; the second device region has a plurality of second transistors disposed therein and the second transistor includes a second dielectric layer 252, at least a portion of which is in a second recess 242, a second gate 262 of the second transistor is located on the second dielectric layer 252, a portion of the second gate 262 is in the second recess 242 and the other portion of the second gate 262 is above the second recess 242, and the thickness of the first dielectric layer 251 is larger than that of the second dielectric layer 252.

As shown in FIG. 7, which is a structural diagram of a semiconductor structure formed in an embodiment of the present application, the semiconductor structure includes a substrate 210, a first active area 231 and a second active area 232, a first dielectric layer 251 and a first transistor thereabove corresponding a first gate 261, and a second dielectric layer 251 and a second transistor thereabove corresponding a second gate 262, wherein portions of the first gate 261 and the second gate 262 are located in the substrate 210 and the other portions of the first gate 261 and the second gate 262 are located above the substrate 210, and the thickness of the first dielectric layer 251 is larger than that of the second dielectric layer 252.

In particular, as shown in FIG. 7, which is a structural diagram of a structure formed by performing the steps S101-S105, by using recess gates, a first recess 241 and a second recess 242 are formed in a substrate 210, subsequently a first dielectric layer 251 and a first gate 261 are sequentially formed in the first recess 241 and a second dielectric layer 252 and a second gate 262 are sequentially formed in the second recess 242, and finally a source and a drain are formed respectively on both sides of each of the first gate 261 and a second gate 262 to form a first and a second transistors corresponding to the first gate 261 and a second gate 262 respectively. By forming the first gate 261 and the second gate 262 which have portions in the substrate 210 and portions above the substrate 210, recess gates can be used to increase the effective contact area between the gates and active areas and increase the channel length of the gates, then the problem of slow I/O of the semiconductor devices is alleviated and thus the footprint of the semiconductor devices can be made smaller. Meanwhile, by using a self-aligning process, the process flow is simplified. By combining the recess gates and self-aligning process, the footprint of the peripheral circuits can be reduced effectively and the process flow is simplified, making further development of semiconductor technologies possible.

Moreover, as shown in FIG. 7, a plurality of isolation structures 220 are formed in the first device region and the second device region respectively, in the vertical direction perpendicular to the substrate 210. The plurality of isolation structures 220 are present in the first and second device regions and between the first and second device regions. The isolation structures 220 may be shallow trench isolations (STI), which could laterally isolate the NMOS regions or PMOS regions. Generally, the material of the shallow trench isolation is oxide, e.g. silicon dioxide.

The semiconductor structure may further include:
a third device region on the substrate 310;
a plurality of third transistors disposed in the third device region, wherein the third transistor includes a third dielectric layer 353 at least partially located in a third recess 343, a third gate 363 of the third transistor is located on the third dielectric layer, a portion of the third gate 3632 is in the third recess 343 and the other portion of the third gate 363 is above the third recess 343, the thicknesses of the first dielectric layer 351, the second dielectric layer 352 and the third dielectric layer 353 decrease in this order.

Different from FIG. 7, as shown in FIG. 12, which is a structural diagram of a semiconductor structure formed in another embodiment of the present application, the semiconductor structure includes: a substrate 310, a first active area 331, a second active area 332 and a third active area 333, a first dielectric layer 351 and a first transistor thereabove corresponding to a first gate 361, a second dielectric layer 352 and a second transistor thereabove corresponding to a second gate 362, and a third dielectric layer 353 and a third transistor thereabove corresponding to a third gate 363, wherein portions of the first gate 361, the second gate 362 and the third gate 363 are located in the substrate 310 and other portions of the first gate 361, the second gate 362 and the third gate 363 are located above the substrate 310, and the thicknesses of the first dielectric layer 351, the second dielectric layer 352 and the third dielectric layer 353 decrease in this order.

In particular, as shown in FIG. 8, when the substrate 310 has a first active area 331, a second active area 332 and a third active area 333 formed therein, the subsequent steps S102-S105 need to be adapted considering the third active area 333 so as to obtain the semiconductor structure shown in the structural diagram of FIG. 12. Related details described above will not be repeated here. By using recess gates, a first recess 341, a second recess 342 and a third recess 343 are formed in a substrate 310; subsequently a first dielectric layer 351 and a first gate 361 are sequentially formed in the first recess 341, a second dielectric layer 352 and a second gate 362 are sequentially formed in the second recess 342, and a third dielectric layer 353 and a third gate 363 are sequentially formed in the third recess 343; and finally a source and a drain are formed respectively on both sides of each of the first gate 361, the second gate 362 and the third gate 363 to form a first, a second and a third transistors corresponding to the first gate 361, the second gate 362 and the third gate 363. By forming the first gate 362, the second gate 362, and the third gate 363 which have portions in the substrate 310 and portions above the substrate 310, recess gates can be used to increase the effective contact area between the gates and active areas and increase the channel length of the gates, so that the problem of slow I/O of the semiconductor devices is alleviated and footprint of the semiconductor devices can be made smaller. Meanwhile, by using a self-aligning process, the process flow is simplified. By using the recess gates and self-aligning process in combination, the footprint of the peripheral circuits can be reduced effectively and the process flow is simplified, making further development of semiconductor technologies possible.

A plurality of isolation structures 320 are disposed among a plurality of first transistors, a plurality of second transistors and a plurality of third transistors to separate the plurality of first transistors, the plurality of second transistors and the plurality of third transistors from each other.

In particular, as shown in FIG. 12, a plurality of isolation structures 320 may also be formed in the first, second and third device regions respectively in the vertical direction perpendicular to the substrate 310. The plurality of isolation structures 320 are present in the first device region, the second device region, the third device region and any region among the first device region, the second device region and the third device region. The isolation structures 320 may be shallow trench isolations (STI) and could laterally isolate the NMOS regions or PMOS regions. Generally, the material of the shallow trench isolation is oxide, e.g. silicon dioxide.

Figure 13:
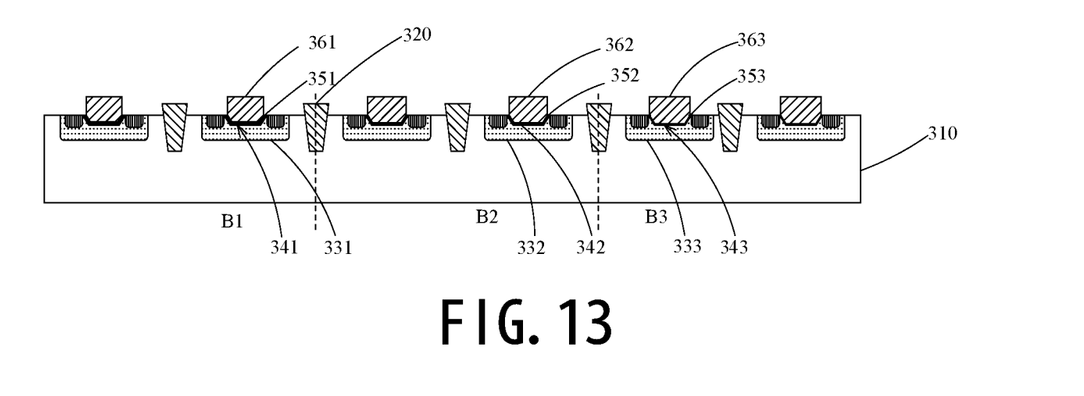
FIG. 13 is a structural diagram in which a semiconductor structure including a plurality of transistors is formed according to still another embodiment of the present application.

In particular, as shown in FIG. 13, the first device region, the second device region, the third device region have a plurality of first transistors, a plurality of second transistors and a plurality of third transistors disposed therein respectively. It can be known from FIG. 13 that a plurality of first transistors are formed in the first device region and isolation structures 320 are formed among the plurality of first transistors to isolate them from each other; a plurality of second transistors are formed in the second device region and isolation structures 320 are formed among the second transistors to isolate them from each other; and a plurality of third transistors are formed in the third device region and isolation structures 320 are formed among the third transistors to isolate them from each other. Additionally, isolation structures 320 are also formed among the first, the second and the third device regions to isolate the transistors in different device regions from each other.

Specifically, the first, second and third device regions are a high-voltage, a low-voltage and a low-low-voltage device regions respectively, which has been discussed in detail above and will not be repeated again here.

Furthermore, in addition to the high-voltage, low-voltage and low-low-voltage device regions, one or more device regions distinct from them may be formed in the peripheral circuits, which is subject to no limitation. When one or more device regions in addition to the high-voltage, low-voltage and low-low-voltage device regions are formed in the substrate, the subsequent steps S102-S105 need to be adapted correspondingly considering the one or more device regions, which has a principle similar to the case of the third device region and will not be repeated here.

Based on the semiconductor structures in embodiments described above, an embodiment of the present application also provides a three-dimensional memory (not shown in the figures). The three-dimensional memory includes an array memory structure and peripheral circuits, wherein any of the semiconductor structures described above may be disposed in the peripheral circuits.

Specifically, the three-dimensional memory (e.g., a 3D NAND Flash) includes an array memory structure and peripheral circuits including any of the semiconductor structures described above. The array memory structure is used to store information. The peripheral circuits may be above or below, or on the periphery of, the array memory structure, and used to control the array memory structure. Moreover, the semiconductor structures may be applied in other microelectronic devices, such as, but not limited to, non-volatile flashes (e.g., NOR flashes).

Based on the semiconductor structures in the embodiments described above, an embodiment of the present application also provides a memory system, which includes a three-dimensional memory including any of the semiconductor structures described above, and a controller coupled to the three-dimensional memory and used to control the three-dimensional memory to store data.

Figure 14:
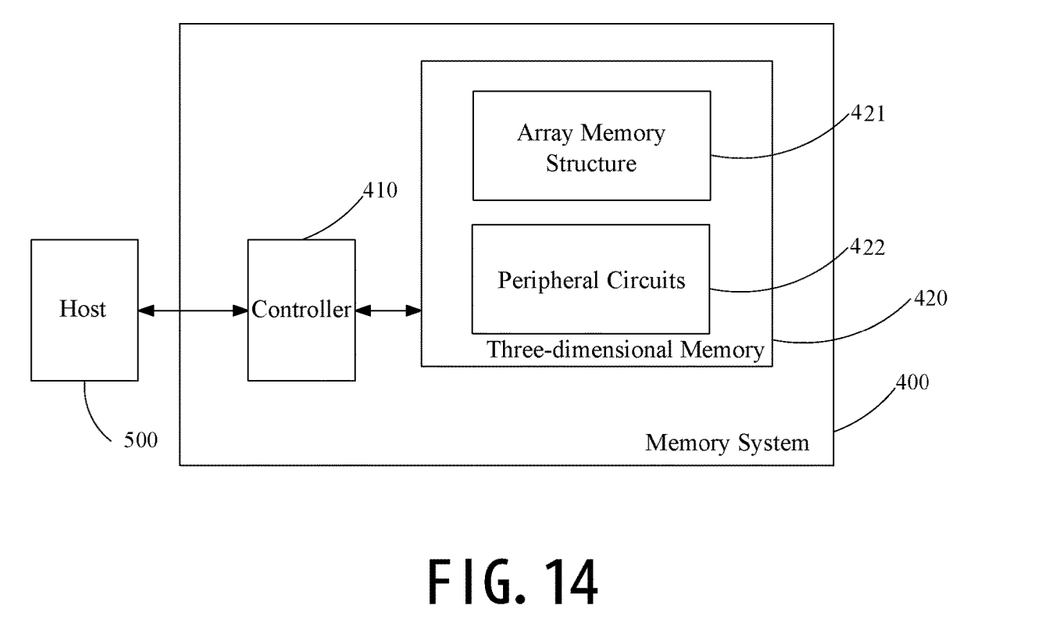
FIG. 14 is a block diagram of a memory system in some embodiments of the present application.

Specifically, as shown in FIG. 14, a memory system 400 includes a controller 410 and one or more three-dimensional memories 420 each having one or more array memory structures 421 and peripheral circuits 422. The memory system 400 may communicate with a host 500 through the controller 410, which may in turn be connected to the one or more three-dimensional memories 420 through pathways therein. Each three-dimensional memory 420 may be controlled by the controller 410 through the pathway in the three-dimensional memory 420.

A semiconductor structure, a fabrication method and a three-dimensional memory are provided in embodiments of the present application. A method of fabricating a semiconductor structure includes: providing a substrate including a first device region and a second device region; ion-doping the first device region and the second device region; forming at least one first recess and at least one second recess in the first device region and the second device region respectively in the vertical direction perpendicular to the substrate; forming a first dielectric layer and a second dielectric layer on the first device region and the second device region respectively, wherein the first dielectric layer is located at least partially on an inner wall of the first recess, the second dielectric layer is located at least partially on an inner wall of the second recess, and the thickness of the first dielectric layer is larger than that of the second dielectric layer; and forming a first gate and a second gate on the first dielectric layer and the second dielectric layer respectively, and forming a source and a drain on both sides of each of the first gate and the second gate, wherein a portion of the first gate is in the first recess and the other portion of the first gate is above the first recess, and a portion of the second gate is in the second recess and the other portion of the second gate is above the second recess. By forming the first gate and the second gate which have portions in the substrate and other portions above the substrate, the footprint of the peripheral circuits is reduced effectively, and meanwhile a self-aligning process can be used to simplify the process flow, making further development of semiconductor technologies possible.

In some embodiments, a semiconductor device includes a transistor in active area. The active area is in a substrate and comprises a recess, a surface of the recess having an offset from a surface of the substrate. The transistor comprises a gate electrode, the gate electrode comprising a first portion in the recess and a second portion outside the recess.

In some embodiments, a cross-sectional shape of the recess has one of an inverted-trapezoidal shape, an arc shape, a rectangular shape, or a spherical shape.

In some embodiments, the semiconductor device further includes a dielectric layer between the gate electrode and the substrate.

In some embodiments, the semiconductor device further includes a second transistor in a second active area. The second active area is in the substrate and comprises a second recess, a surface of the second recess having a second offset from the surface of the substrate. The second transistor comprises a second gate electrode, the second gate electrode comprising a first portion in the second recess and a second portion outside the second recess. A second dielectric layer is between the second gate electrode and the substrate.

In some embodiments, a thickness of the dielectric layer is greater than a thickness of the second dielectric layer.

In some embodiments, a maximum operating voltage of the active area is higher than a maximum operating voltage of the second active area.

In some embodiments, the semiconductor device further includes a third transistor in a third active area. The third active area is in the substrate and comprises a third recess, a surface of the third recess having a third offset from the surface of the substrate. The third transistor comprises a third gate electrode, the third gate electrode comprising a first portion in the second recess and a second portion outside the third recess. A third dielectric layer is between the third gate electrode and the substrate. A thickness of the second dielectric layer is greater than a thickness of the third dielectric layer.

In some embodiments, a maximum operating voltage of the second active area is higher than a maximum operating voltage of the third active area.

In some embodiments, the transistor further comprises a drain electrode and a source electrode in the active area.

In some embodiments, a 3D memory device includes a memory array and a peripheral circuit. The peripheral circuit includes a transistor in active area. The active area is in a substrate and comprises a recess, a surface of the recess having an offset from a surface of the substrate. The transistor comprises a gate electrode, the gate electrode having a first portion in the recess and a second portion outside the recess.

In some embodiments, a cross-sectional shape of the recess has one of an inverted-trapezoidal shape, an arc shape, a rectangular shape, or a spherical shape.

In some embodiments, the 3D memory device further includes a dielectric layer between the gate electrode and the substrate.

In some embodiments, the 3D memory device further includes a second transistor in a second active area. The second active area is in the substrate and comprises a second recess, a surface of the second recess having a second offset from the surface of the substrate. The second transistor comprises a second gate electrode, the second gate electrode comprising a first portion in the second recess and a second portion outside the second recess. A second dielectric layer is between the second gate electrode and the substrate. A thickness of the dielectric layer is greater than a thickness of the second dielectric layer.

In some embodiments, a method for forming a semiconductor device includes forming an active area in a substrate; forming a recess in the active area, a surface of the recess having an offset from a surface of the substrate; and forming a gate electrode above the surface of the recess.

In some embodiments, a cross-sectional shape of the recess has one of an inverted-trapezoidal shape, an arc shape, a rectangular shape, or a spherical shape.

In some embodiments, forming the active area comprises performing ion-doping in a device region of the substrate.

In some embodiments, the method further includes performing a thermal oxidation to form a dielectric layer between the gate electrode and the substrate.

In some embodiments, the method further includes forming a second active area in a substrate, and forming a second recess in the second active area. A surface of the second recess has a second offset from the surface of the substrate. The method further includes forming a second gate electrode above the surface of the second recess, and forming a second dielectric layer between the second gate electrode and the substrate. The second dielectric layer and the first dielectric layer are formed separately.

In some embodiments, a thickness of the first dielectric layer is greater than a thickness of the second dielectric layer. Forming the first dielectric layer and the second dielectric layer comprises forming a first patterned photoresist layer over the substrate, the first patterned photoresist layer exposing the first recess; performing the thermal oxidation on the first recess to deposit a first layer of dielectric material in the first recess; forming a second patterned photoresist layer over the substrate, the second patterned photoresist layer exposing the first recess and the second recess; and performing a second thermal oxidation on the first recess and the second recess to respectively deposit a second layer of dielectric material in the first recess and the second recess, to form the first dielectric layer and the second dielectric layer.

In some embodiments, the gate electrode is formed by physical vapor deposition (PVD).

What have been described above are only preferred embodiments of the present application and not intended to limit the present application. Any modifications, equivalent substitutions and improvements made within the spirit and principle of the present application should be covered by the scope of the present application.

What is claimed is:

1. A semiconductor device, comprising a first transistor in a first active area,
    wherein
    the first active area is in a substrate and comprises a recess, a surface of the recess having an offset from a surface of the substrate;
    the first transistor comprises a gate electrode, the gate electrode comprising a first portion in the recess and a second portion outside the recess; and
    a second transistor is arranged in a second active area, and an isolation structure is arranged between the first active area and the second active area, a portion of the isolation structure being above the recess.

2. The semiconductor device of claim 1, wherein a cross-sectional shape of the recess has one of an inverted-trapezoidal shape, an arc shape, a rectangular shape, or a spherical shape.

3. The semiconductor device of claim 1, further comprising a dielectric layer between the gate electrode and the substrate.

4. The semiconductor device of claim 1, further comprising the second transistor in the second active area, wherein:
    the second active area is in the substrate and comprises a second recess, a surface of the second recess having a second offset from the surface of the substrate;
    the second transistor comprises a second gate electrode, the second gate electrode comprising a first portion in the second recess and a second portion outside the second recess; and
    a second dielectric layer is between the second gate electrode and the substrate.

5. The semiconductor device of claim 4, wherein a thickness of a first dielectric layer of the first transistor is greater than a thickness of the second dielectric layer.

6. The semiconductor device of claim 5, wherein a maximum operating voltage of the first active area is higher than a maximum operating voltage of the second active area.

7. The semiconductor device of claim 6, further comprising a third transistor in a third active area, wherein:
    the third active area is in the substrate and comprises a third recess, a surface of the third recess having a third offset from the surface of the substrate;
    the third transistor comprises a third gate electrode, the third gate electrode comprising a first portion in the second recess and a second portion outside the third recess;
    a third dielectric layer is between the third gate electrode and the substrate; and
    a thickness of the second dielectric layer is greater than a thickness of the third dielectric layer.

8. The semiconductor device of claim 7, wherein a maximum operating voltage of the second active area is higher than a maximum operating voltage of the third active area.

9. The semiconductor device of claim 1, wherein the first transistor further comprises a drain electrode and a source electrode in the first active area.

10. A three-dimensional (3D) memory device, comprising a memory array and a peripheral circuit, wherein the peripheral circuit comprises a first transistor in a first active area, wherein
    the first active area is in a substrate and comprises a recess, a surface of the recess having an offset from a surface of the substrate;
    the first transistor comprises a gate electrode, the gate electrode comprising a first portion in the recess and a second portion outside the recess; and
    a second transistor is arranged in a second active area, and an isolation structure is arranged between the first active area and the second active area, a portion of the isolation structure being above the recess.

11. The 3D memory device of claim 10, wherein a cross-sectional shape of the recess has one of an inverted-trapezoidal shape, an arc shape, a rectangular shape, or a spherical shape.

12. The 3D memory device of claim 10, further comprising a dielectric layer between the gate electrode and the substrate.

13. The 3D memory device of claim 10, further comprising the second transistor in the second active area, wherein:
    the second active area is in the substrate and comprises a second recess, a surface of the second recess having a second offset from the surface of the substrate;
    the second transistor comprises a second gate electrode, the second gate electrode comprising a first portion in the second recess and a second portion outside the second recess;
    a second dielectric layer is between the second gate electrode and the substrate; and
    a thickness of a first dielectric layer of the first transistor is greater than a thickness of the second dielectric layer.

14. A method for forming a semiconductor device, comprising:
  forming a first active area in a substrate;
  forming a recess in the first active area, a surface of the recess having an offset from a surface of the substrate; and
  forming a gate electrode in the recess and above the surface of the recess, a first transistor comprising the gate electrode
  wherein:
    a second transistor is arranged in a second active area, and an isolation structure is arranged between the first active area and the second active area, a portion of the isolation structure being above the recess.

15. The method of claim 14, wherein a cross-sectional shape of the recess has one of an inverted-trapezoidal shape, an arc shape, a rectangular shape, or a spherical shape.

16. The method of claim 14, wherein forming the first active area comprises performing ion-doping in a device region of the substrate.

17. The method of claim 14, further comprising performing a thermal oxidation to form a dielectric layer between the gate electrode and the substrate.

18. The method of claim 17, further comprising:
  forming the second active area in the substrate;
  forming a second recess in the second active area, a surface of the second recess having a second offset from the surface of the substrate;
  forming a second gate electrode above the surface of the second recess; and
  forming a second dielectric layer between the second gate electrode and the substrate, wherein the second dielectric layer and a first dielectric layer of the first transistor are formed separately, the second transistor comprising the second gate electrode and the second dielectric layer.

19. The method of claim 18, wherein a thickness of the first dielectric layer is greater than a thickness of the second dielectric layer, and wherein the recess is a first recess, and forming the first dielectric layer and the second dielectric layer comprises:
  forming a first patterned photoresist layer over the substrate, the first patterned photoresist layer exposing the first recess;
  performing the thermal oxidation on the first recess to deposit a first layer of dielectric material in the first recess;
  forming a second patterned photoresist layer over the substrate, the second patterned photoresist layer exposing the first recess and the second recess; and
  performing a second thermal oxidation on the first recess and the second recess to respectively deposit a second layer of dielectric material in the first recess and the second recess, to form the first dielectric layer and the second dielectric layer.

20. The method of claim 14, wherein the gate electrode is formed by physical vapor deposition (PVD).

* * * * *